US012559845B2

(12) United States Patent
Weaver et al.

(10) Patent No.: US 12,559,845 B2
(45) Date of Patent: Feb. 24, 2026

(54) EROSION RESISTANT COATINGS APPLIED BY VARIABLE BIAS CATHODIC ARC DEPOSITION

(71) Applicant: General Electric Company, Schenectady, NY (US)

(72) Inventors: Scott Andrew Weaver, Ballston Lake, NY (US); Joshua Roger Salisbury, Albany, NY (US); Aida Amroussia, Paris (FR); Jon Michael Wilcox, Watervliet, NY (US); Patrick Taylor Shower, Nassau, NY (US)

(73) Assignee: GE Infrastructure Technology LLC, Greenville, SC (US)

( * ) Notice: Subject to any disclaimer, the term of this patent is extended or adjusted under 35 U.S.C. 154(b) by 686 days.

(21) Appl. No.: 18/054,171

(22) Filed: Nov. 10, 2022

(65) Prior Publication Data

US 2024/0158922 A1 May 16, 2024

(51) Int. Cl.
*C23C 14/32* (2006.01)
*C23C 26/02* (2006.01)
*H01J 37/32* (2006.01)

(52) U.S. Cl.
CPC ............ *C23C 26/02* (2013.01); *C23C 14/325* (2013.01); *H01J 37/32055* (2013.01)

(58) Field of Classification Search
None
See application file for complete search history.

(56) References Cited

U.S. PATENT DOCUMENTS

| | | | |
|---|---|---|---|
| 2002/0046941 A1 | 4/2002 | Takigawa et al. | |
| 2010/0294350 A1 | 11/2010 | Ko et al. | |
| 2013/0302596 A1 | 11/2013 | Vetter et al. | |
| 2015/0232978 A1* | 8/2015 | Schier | C23C 30/005 428/141 |

FOREIGN PATENT DOCUMENTS

| | | | | |
|---|---|---|---|---|
| CN | 109576643 A | * | 4/2019 | C23C 14/0641 |
| KR | 100758033 B1 | | 9/2007 | |
| KR | 20180054176 A | | 5/2018 | |

OTHER PUBLICATIONS

International Preliminary Report on Patentability mailed May 22, 2025 for PCT/US2023/073753 filed Sep. 8, 2023; pp. 7.

(Continued)

*Primary Examiner* — Jason Berman
(74) *Attorney, Agent, or Firm* — James Pemrick; Charlotte Wilson; Hoffman Warnick LLC

(57) ABSTRACT

A cathodic arc coating system includes alternating layers of at least one of titanium vanadium nitride (TiVN) and titanium silicon vanadium nitride (TiSiVN) disposed on a substrate; and alternating layers of titanium vanadium chromium nitride (TiVCrN) and titanium silicon vanadium nitride (TiSiVCrN) disposed on a substrate. A cathodic arc process includes a sub-hertz variable bias forming the alternating layers of alternating layers of at least one of titanium vanadium nitride (TiVN) and titanium silicon vanadium nitride (TiSiVN) disposed on a substrate; and alternating layers of titanium vanadium chromium nitride (TiVCrN) and titanium silicon vanadium nitride (TiSiVCrN) disposed on a substrate.

20 Claims, 4 Drawing Sheets

(56) References Cited

OTHER PUBLICATIONS

Fernandes et al., Lubricous TiSi(V)N Coatings for Extreme Temperature Application Deposited by Deep Oscillation Magnetron Sputtering (DOMS) Mode, VIII Iberian Conference on Tribology, Jun. 18-19, 2015, pp. 287-294.

Fernandes et al., Oxidation and Diffusion Process During Annealing of TiSi(V)N Films, Surface & Coatings Technology 275, May 31, 2015, pp. 120-126.

Restrepo et al., "Cathodic Arc Evaporation of Self-Lubricating TiSiVN Coatings", Journal of Materials Engineering and Performance vol. 31(3), Mar. 2022, pp. 1857-1869.

Fernandes et al., "Tribological Properties of Self-Lubricating TiSiVN Coatings at Room Temperature", Surface & Coatings Technology 267, Oct. 12, 2014, pp. 8-14.

Written Opinion of the International Search Authority mailed Dec. 26, 2023 for PCT/US2023/073753 filed Sep. 8, 2023; pp. 8.

* cited by examiner

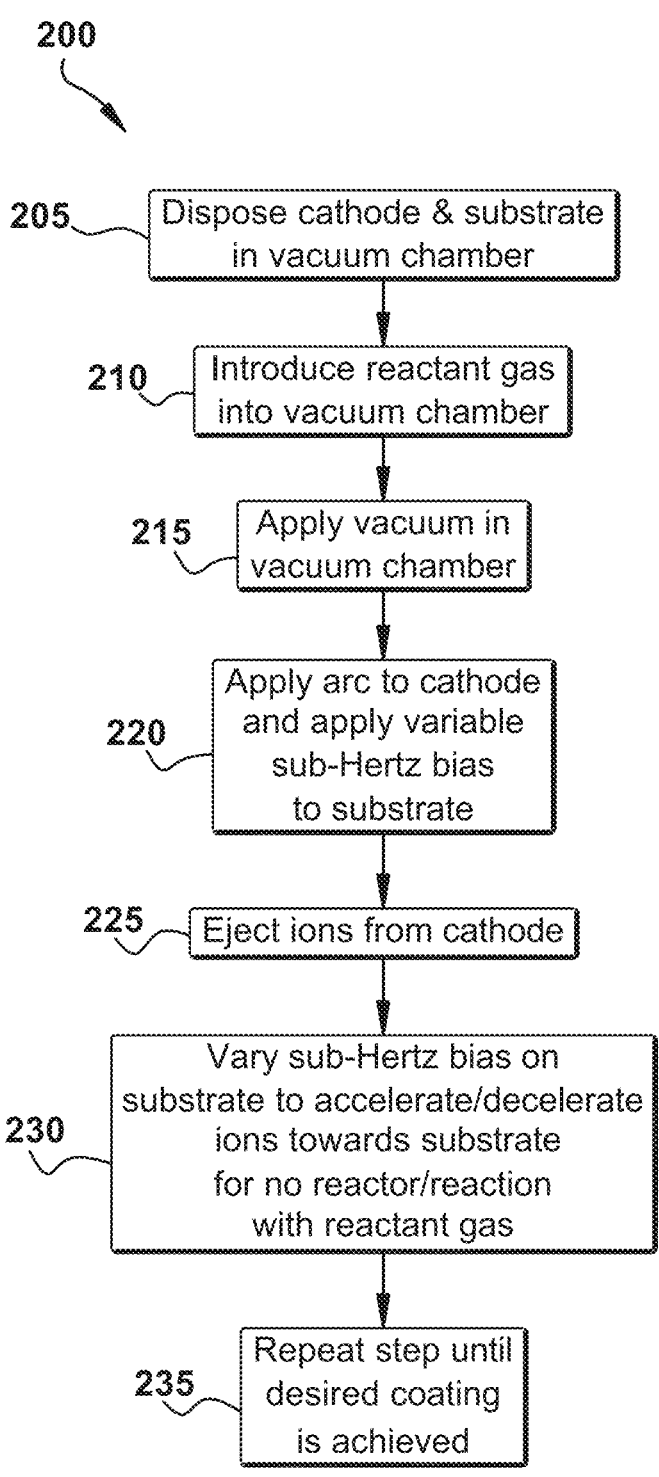

200

205 — Dispose cathode & substrate in vacuum chamber

210 — Introduce reactant gas into vacuum chamber

215 — Apply vacuum in vacuum chamber

220 — Apply arc to cathode and apply variable sub-Hertz bias to substrate

225 — Eject ions from cathode

230 — Vary sub-Hertz bias on substrate to accelerate/decelerate ions towards substrate for no reactor/reaction with reactant gas 235 — Repeat step until desired coating is achieved

FIG. 2

EROSION RESISTANT COATINGS APPLIED BY VARIABLE BIAS CATHODIC ARC DEPOSITION

STATEMENT REGARDING FEDERALLY SPONSORED RESEARCH & DEVELOPMENT

The U.S. Government may have certain rights in this invention pursuant to DOE Contract No. DE-FE0031911, awarded by United States Department of Energy.

TECHNICAL FIELD

The disclosure relates generally to coatings. More particularly, the disclosure relates to coatings applied by sub-hertz variable bias ion plasma deposition.

BACKGROUND

Solid particle erosion of steam turbine components limits the ability of power generation operators to perform aggressive loading following an outage without risking premature damage, and therefore increases the levelized cost of electricity.

Two types of coatings have been proposed to mitigate solid particle erosion. A first coating is thermally sprayed CrC—NiCr, branded DiamondTuff®, which has a service record of durability but decreases high pressure steam turbine efficiency significantly. This aerodynamic efficiency loss may be largely due to the thickness of the thermally sprayed coating—6 to 10 mils.

The second coating is TiN deposited by cathodic arc. TiN coating deposited by cathodic arc can be less than about 0.5 mils thick and therefore does not introduce significant aerodynamic efficiency loss. However, it may not have adequate durability to prevent turbine blade damage between scheduled outages. Simply increasing the thickness of the cathodic arc TiN coating may result in spallation due to residual stresses.

It is often beneficial to incorporate nanoscale (1-100 nm) layers in a cathodic arc coating's microstructure. But methods available to do so today require multiple cathodes and planetary sample rotation.

BRIEF DESCRIPTION

All aspects, examples and features mentioned below can be combined in any technically possible way.

An aspect of the disclosure provides a cathodic arc coating system; the coating system comprising alternating layers of titanium vanadium nitride (TiVN) and titanium silicon vanadium nitride disposed on a substrate.

Another aspect of the disclosure includes any of the preceding aspects, and wherein the alternating layers have a thickness in a range from about 1 nanometer (nm) to about 100 nanometers (nm).

Another aspect of the disclosure includes any of the preceding aspects, and wherein the alternating layers have a thickness in a range from about 5 nanometers (nm) to about 100 nanometers (nm).

Another aspect of the disclosure includes any of the preceding aspects, wherein the alternating layers have a thickness of about 10 nanometers (nm).

Another aspect of the disclosure includes any of the preceding aspects, and wherein the alternating layers are disposed on the substrate by a sub-hertz variable bias cathodic arc.

Another aspect of the disclosure includes any of the preceding aspects, and wherein the alternating layers are disposed on the substrate by a sub-hertz variable bias cathodic arc, wherein the sub-hertz variable bias varies with time as an approximate sinusoidal wave, the approximate sinusoidal wave having a frequency in a range between 0.1 hertz (Hz) and about 1 Hz.

Another aspect of the disclosure includes any of the preceding aspects, and wherein the alternating layers are disposed on the substrate by a sub-hertz variable bias, wherein the sub-hertz variable bias includes a modified variable bias waveform with a voltage bias to control the incorporation of vanadium (V), silicon (Si), and/or chromium (Cr) incorporate vanadium (V) and silicon (Si).

Another aspect of the disclosure includes any of the preceding aspects, and wherein the cathodic arc system includes a chamber and a consumable cathode in the chamber, wherein the substrate is disposed in communication with the chamber and consumable cathode, and the substrate functions as an anode; wherein the sub-hertz variable bias generates an electrical arc on the cathode, the arc traverses the cathode, the arc interacts with the consumable cathode and creates highly energized metallic ions, the highly energized metallic ions are ejected from the consumable cathode, and the highly energized ions are accelerated to the substrate.

Another aspect of the disclosure includes any of the preceding aspects, and wherein the substrate is provided with a negative charge.

Another aspect of the disclosure includes any of the preceding aspects, and wherein the chamber includes nitrogen (N) gas therein.

Another aspect of the disclosure includes any of the preceding aspects, and wherein the cathode includes titanium (Ti), vanadium (V), silicon (Si), and sometimes chromium (Cr).

An aspect of the disclosure provides a sub-hertz variable bias cathodic arc process, the cathodic process comprising deposing a coating on a substrate with alternating layers of titanium vanadium nitride (TiVN) and titanium silicon vanadium nitride (TiSiVN) on a substrate.

Another aspect of the disclosure includes any of the preceding aspects, and wherein the alternating layers have a thickness in a range from about 1 nanometer (nm) to about 100 nanometers (nm).

Another aspect of the disclosure includes any of the preceding aspects, and wherein the alternating layers have a thickness of about 10 nanometers (nm).

Another aspect of the disclosure includes any of the preceding aspects, and disposing the alternating layers includes depositing by a sub-hertz variable bias cathodic arc.

Another aspect of the disclosure includes any of the preceding aspects, and the sub-hertz variable bias varies with time as an approximate sinusoidal wave, the approximate sinusoidal wave having a frequency in a range between 0.1 hertz (Hz) and about 1 Hz.

Another aspect of the disclosure includes any of the preceding aspects, and the sub-hertz variable bias varies with time in a periodic manner, with one or more periodic features of the waveform being expressed with a frequency in a range between 0.1 hertz (Hz) and about 1 Hz.

Another aspect of the disclosure includes any of the preceding aspects, and wherein the sub-hertz variable bias includes a modified variable bias waveform with a modified maximum voltage bias to control Si content.

Another aspect of the disclosure includes any of the preceding aspects, and wherein the cathodic arc process includes disposing a consumable cathode in a chamber; disposing the substrate in communication with the chamber, the chamber functions as a anode and the substrate functions as an anode; disposing reactant gas in the chamber; applying a sub-hertz variable bias to the cathode, generating an electrical arc on the cathode by the applying the sub-hertz variable bias to the cathode; and the arc traverses a face of the cathode; creating highly energized metallic ions by the arc interacting with the consumable cathode; ejecting highly energized metallic ions from the face of the consumable cathode; and accelerating the highly energized ions to the substrate.

Another aspect of the disclosure includes any of the preceding aspects, and, wherein applying the sub-hertz variable bias includes applying the sub-hertz variable bias at a first frequency where the ejected highly energized metallic ions from the consumable cathode pass through the reactant gas at a first speed and do not react with at least one of nitrogen and oxygen, and the ejected highly energized metallic ions are deposited on the substrate; and applying the sub-hertz variable bias at a second frequency where the ejected highly energized metallic ions pass through the reactant gas at a second speed in the chamber, wherein at the second speed the ejected highly energized metallic ions enable a chemical reaction with nitrogen to form a reaction product, and the reaction product is deposited on the substrate.

Another aspect of the disclosure includes any of the preceding aspects, and, wherein the substrate is provided with a negative charge relative to the consumable cathode.

Another aspect of the disclosure includes any of the preceding aspects, and wherein the chamber includes nitrogen (N), and the consumable cathode includes titanium (Ti), vanadium (V), silicon (Si), and sometimes chromium (Cr).

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which:

FIG. 2 is a flowchart for applying layers onto a substrate from a variable bias cathodic arc device, according to embodiments of the disclosure;

Figure 1:
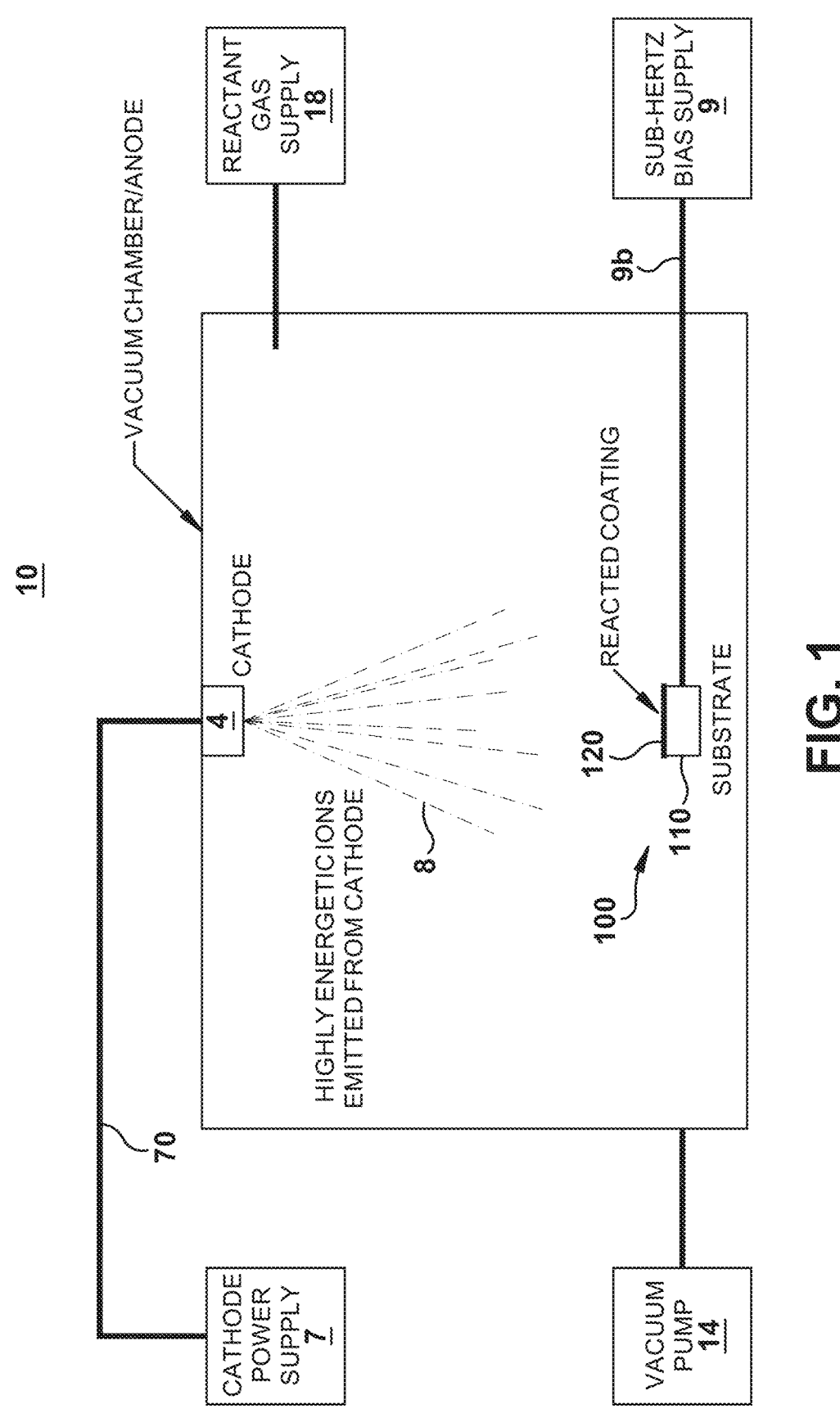
FIG. 1 is a schematic view of a variable bias cathodic arc device, according to embodiments of the disclosure.

It is noted that the drawings of the disclosure are not necessarily to scale. The drawings are intended to depict only typical aspects of the disclosure and therefore should not be considered as limiting the scope of the disclosure. In the drawings, like numbering represents like elements between the drawings.

DETAILED DESCRIPTION

As an initial matter, in order to clearly describe the subject matter of the current disclosure, it will become necessary to select certain terminology when referring to and describing relevant machine components within turbomachinery, including but not limited to steam turbines, where the steam turbines can include low, intermediate, and high-pressure steam turbines. To the extent possible, common industry terminology will be used and employed in a manner consistent with its accepted meaning. Unless otherwise stated, such terminology should be given a broad interpretation consistent with the context of the present application and the scope of the appended claims. Those of ordinary skill in the art will appreciate that often a particular component may be referred to using several different or overlapping terms. What may be described herein as being a single part may include and be referenced in another context as consisting of multiple components. Alternatively, what may be described herein as including multiple components may be referred to elsewhere as a single part.

In addition, several descriptive terms may be used regularly herein, as described below. The terms "first," "second," and "third" may be used interchangeably to distinguish one component from another and are not intended to signify location or importance of the individual components.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components but do not preclude the presence or addition of one or more other features, integers, steps, operations, elements, components, and/or groups thereof. "Optional" or "optionally" means that the subsequently described event or circumstance may or may not occur or that the subsequently describe component or element may or may not be present, and that the description includes instances where the event occurs, or the component is present and instances where it does not or is not present.

Where an element or layer is referred to as being "on," "engaged to," "connected to" or "coupled to" another element or layer, it may be directly on, engaged to, connected to, or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Solid particle erosion of turbomachinery components, such as but not limited to steam turbine components, may limit turbomachinery component lifetimes. Also, solid particle erosion may reduce the ability of turbomachinery operators to attempt aggressive loading without risking premature damage to the turbomachinery components. Limiting aggressive loading, which may be needed to meet electricity demand, prevent blackouts, rolling brownouts, or stationary brownouts, increases the cost of electricity for all users.

As illustrated in the Figures, the cathodic arc titanium silicon vanadium nitride (TiSiVN) or titanium silicon vanadium chromium nitride (TiSiVCrN) coated layered substrate structure 100 (FIG. 3), as embodied by the disclosure, provides a very thin, smooth, and erosion resistant coating 120 on a substrate 6 both before use and after use of the steam turbine that may create oxidation. Specifically, the cathodic arc TiSiVN or TiSiVCrN coated layered substrate structure 100 can be up to about up to 400% more durable in post-steam erosion testing than two (2) component (CrC—NiCr) conventional erosion resistant coatings, for example DiamondTuff', despite the fact that these conventional coatings are much thicker (they may be deposited at a thickness of about 6 to about 10 mils). The cathodic arc TiSiVN coating system 100 includes erosion resistant coating 120 that is about 10-20 times thinner and about 75-95% lighter than DiamondTuff. Even though it is applied using essentially the same hardware as a conventional cathodic arc process for titanium nitride (TiN), cathodic arc TiSiVN coated layered substrate structure 100, which is deposited by sub-hertz variable bias cathodic arc according to the disclosure, has up to about 24 times the erosion resistance as-deposited and about 14 times the erosion resistance post-steam, compared to conventional cathodic arc TiN.

These properties of the cathodic arc TiSiVN or TiSiVCrN coated layered substrate structure 100 (FIG. 3) can be achieved by a combination of process parameters for cathodic arc deposition, which are provided at a sub-hertz variable bias, and including depositing TiN with silicon (Si), vanadium (V), and optionally chromium (Cr) in the consumable cathode. High nano-hardness phases, low oxidation rate, and a modulated residual stress can be produced in the cathodic arc TiSiVN coating system 10 (FIG. 1) and process 200 (FIG. 2) through this microstructure and compositional control.

Figure 3:
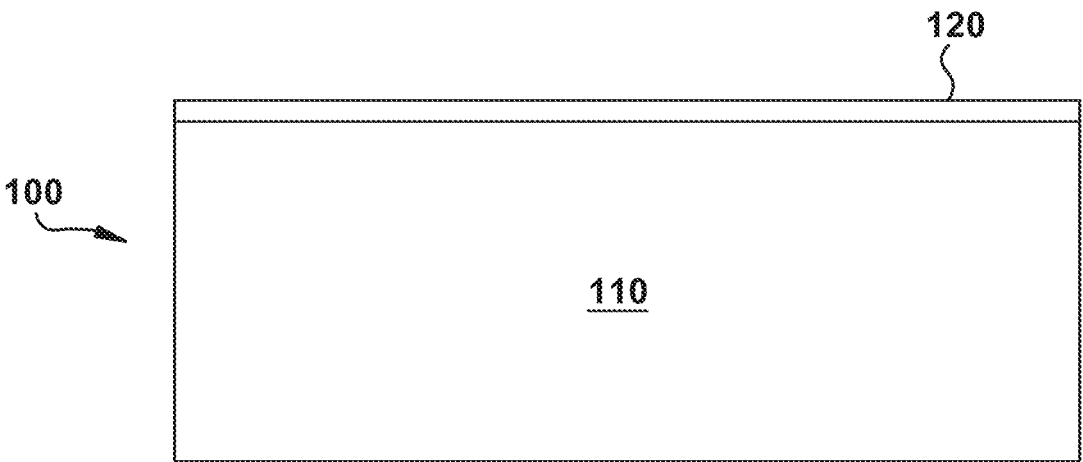
FIG. 3 is a side view of a coated layered substrate structure applied by a variable bias cathodic arc device and process, according to embodiments of the disclosure.

With reference to FIGS. 1-3, the variable bias cathodic arc device 10 (FIG. 1) and method 200 (FIG. 2) result in cathodic arc TiSiVN or TiSiVCrN coated layered substrate structure 100 (FIG. 3), as will be described.

FIG. 1 shows a variable bias cathodic arc device 10, as embodied by the disclosure. In FIG. 1, chamber 1 is defined by dual walls 2 and 3 that form a dual walled chamber 1 into which a reactant gas can be fed. In certain aspects of the disclosure, the reactant gas is nitrogen (N 2). Dual walls 2 and 3 of chamber 1 are connected to electrical circuitry 7 and thus form electrodes that function as an anode.

Referring to both FIGS. 1 and 2, in step 205, a consumable cathode 4 is disposed in chamber 1. In accordance with certain aspects of the disclosure, consumable cathode 4 is composed of titanium, silicon, vanadium, and sometimes chromium. Consumable cathode 4 extends into dual walled chamber 1 and into reactant gas, e.g., $N_2$, at chamber portion 1$a$. In step 210, substrate 6 is disposed in cooperation with a variable bias, whereby substrate 6 is positioned to be coated by variable bias cathodic arc device 10, as described hereinafter. As embodied by the disclosure, steps 205 and 210 can be inverted, where the reactant gas is disposed into chamber and then the cathode and substrate are disposed in the vacuum chamber.

In step 215, a reactant gas is fed to the variable bias cathodic arc device 10 in chamber 1. In accordance with certain aspects of the embodiments of the disclosure, the reactant gas includes at least one of nitrogen ($N_2$) and oxygen ($O_2$).

Variable bias cathodic arc device 10 includes electrical circuitry 7. In step 220, electrical circuitry 7 can create an arc or an electrical pulse 5 (hereinafter "arc 5") between cathode and anode. Electrical circuitry 7 also creates a negative charge on substrate 6, which is to be coated by the cathodic arc process 200 and variable bias cathodic arc device 10.

As the arc 5 traverses the consumable cathode 4, the interaction generates highly energized metallic ions 8. In step 225, highly energized metallic ions 8 are ejected from consumable cathode 4 by the arc 5 passing thereby.

In step 230, highly energized metallic ions 8 are accelerated, toward an article or substrate 6 to be coated. Since highly energized metallic ions 8 have a positive charge, the positively charged highly energized metallic ions 8 can be accelerated toward substrate 6 by placing a negative charge on the article or substrate 6 to be coated. That is, substrate has a negative voltage (bias) applied thereto by circuitry 7.

As embodied by the disclosure, biasing varies at a sub-hertz frequency. Thus, the speed of highly energized metallic ions 8 through the reactant gas at chamber portion 1$a$ can be controlled. If the bias were to be increased to a high enough level but still sub-hertz, then highly energized metallic ions 8 would travel fast enough through the reactant gas to allow for non-reaction to occur and deposit metal as at least one erosion resistant coating layer 120 (FIG. 3) upon the article or substrate 6. If the sub-hertz bias was to then be dropped (varied) to a lower level, step 235, then highly energized metallic ions 8 will have sufficient time to react with the gas, e.g., $N_2$, and deposit an erosion resistant coating layer 120 on the article or substrate 6. Also, any consumable cathode constituents, for instance one of Si and V; chromium (Cr) and V; and Si, V, and Cr can be included with the highly energized metallic ions 8.

Figure 4:
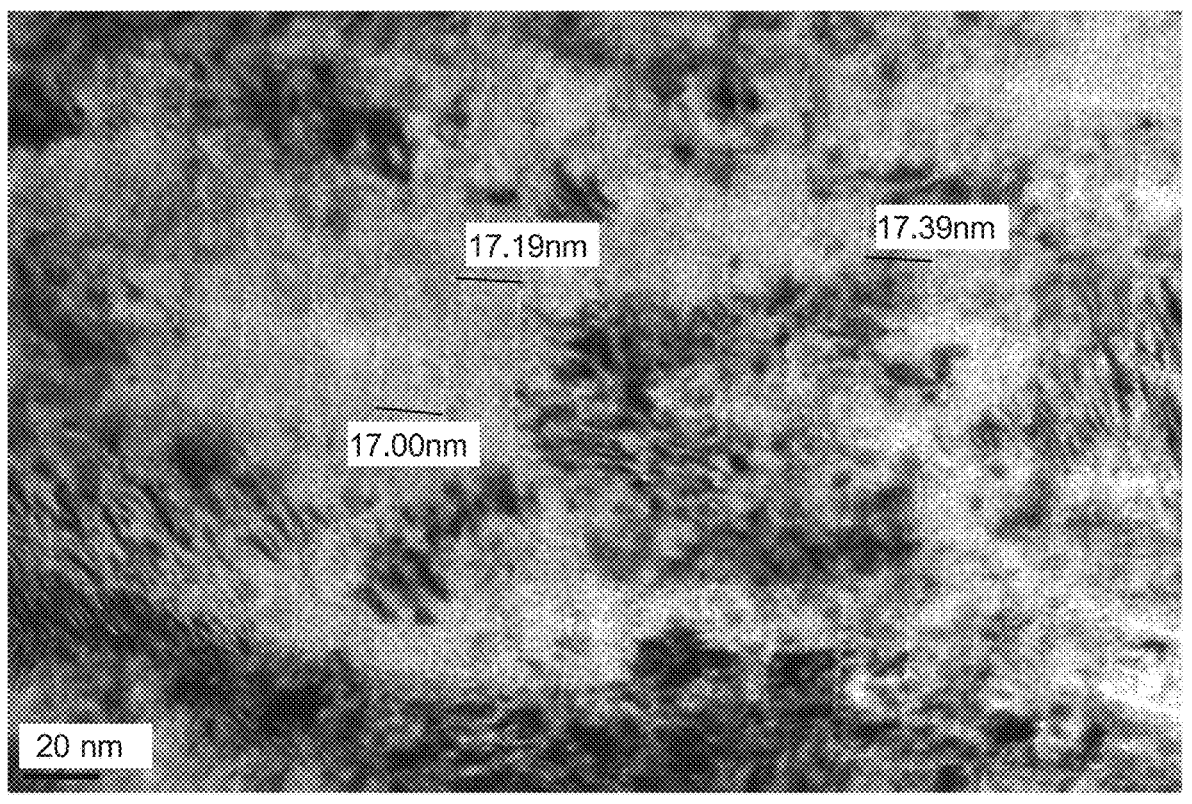
FIG. 4 is a micrograph of the microstructure of a coated layered substrate structure, according to embodiments of the disclosure.

In step 240, the process continues repeating the accelerating and decelerating, steps 230 and 235, respectfully, until a desired thickness of erosion resistant coating layer 120 (FIG. 3) is achieved. If this constant cycling or varying of bias occurs during the entire deposition process, then the metallurgical architecture is erosion resistant coating layer 120 microstructure. The microstructure of erosion resistant coating layer 120 (FIGS. 3 and 4) can enhance overall characteristics of the coating. The variable bias cyclic action will create erosion resistant coating layers 120 of titanium Si V (Cr) nitride (with any doping constituents), then Ti V (Cr), then titanium Si V (Cr) nitride, etc., until the coating cycles are complete. This altering of layers (see FIG. 4) in coated layered substrate structure 100 and erosion resistant coating layer 120 can enhance the hardness and resistance to erosion through the coating.

The cathodic arc coating, as embodied by the disclosure can be up to 400% more durable in post-steam erosion testing than known coatings applied with thermal spray, while being 10-20 times thinner and 75-95% lighter. Even though it is applied using essentially the same hardware as conventional cathodic arc TiN, it has up to approximately 24 times the erosion resistance as-deposited and 14 times the erosion resistance post-steam compared to conventional cathodic arc TiN. It is therefore likely to mitigate erosion damage to steam turbine blades without introducing a significant aerodynamic debit.

Plasma in arc 5, for the variable bias cathodic arc process 200, as embodied by the disclosure, can be generated with the frequency in a range between about $10^{-1}$ Hz and about 1 Hz. Further, in certain aspects of the disclosure, plasma in arc 5 from the variable bias cathodic arc process 200 can be generated with the sub-hertz variable bias. As embodied by the disclosure, variable bias can be varied with time and can have an approximately sinusoidal wave form with a frequency in a range between 0.1 hertz (Hz) and about 1 Hz.

The lifetime of plasma in arc 5 for each impulse in the variable bias cathodic arc can be of order of $10^{-4}$ seconds. During the discharge of arcs, individual plasmoids can be accelerated with an Ampere force on the order of $10^4$ meters/sec (m s$^{-1}$) and directed toward substrate 6. Substrate 6 is not heated by any external heat source prior, during and after process 200. Nucleation of TiN takes place on highly energized metallic ions 8 and a layer is constituted by subnano- or nano particles on substrate 6.

As embodied by the disclosure, process 200 applies a variable bias to substrate 6 being coated. The sub-hertz variable bias enables beneficial problem-solving effects. Sub-hertz variable bias cathodic arc process 200, as embodied by the disclosure, is conducted with a frequency of the variable bias waveform less than about 1 Hz. Sub-hertz variable bias cathodic arc with a frequency of the variable bias waveform less than about 1 Hz can result in nanoscale layers, where the layers alternate in composition via the variable bias.

In accordance with one aspect of the disclosure, the sub-hertz variable bias can be at one level for up to about 1.5 to 3.5 seconds and transition to the other level for another about 1.5 to 3.5 seconds. Other time intervals are within the scope of the embodiments.

The coated layered substrate structure 100 includes improvements in as-deposited erosion resistance, retention of erosion resistance after steam exposure up to about 600° C., and reduced mass changes in steam oxidation occurs. Sub-hertz variable bias cathodic arc process 200 may also enable deposition of some coatings that may have spalled during deposition a constant bias process.

Coated layered substrate structure 100 has a compositional chemistry, as embodied by the disclosure, including titanium nitride (TiN). TiN is considered an erosion resistant coating with steam oxidation resistance. Compositional chemistry includes vanadium (V), silicon (Si), and chromium (Cr), which can be addition constituents of the consumable cathode into the TiN during the variable bias cycling.

Evaporating a cathode of TiSiV to form TiSiVN (or a cathode of TiSiVCr to form TiSiVCrN) results in increases in performance. Si doping is known to increase the hardness and oxidation resistance of TiN under conditions relevant to steam turbine operation. V doping is known to decrease the residual stress within TiN. Further, V doping of TiSiN may encourage formation of thermodynamically stable Rutile phase titanium oxide during steam oxidation rather than the metastable Anatase phase titanium oxide.

The chart hereinafter sets forth constituents for consumable cathode 4. The chart further provides the resultant constituent ranges for the respective erosion resistant coating layer 120.

Moreover, as embodied by the disclosure, Si and V co-doping of TiN under the influence of a sub-hertz variable bias cathodic arc process may result in an improvement in post-steam erosion prevention during and after use of the steam turbine.

The foregoing drawings show some of the processing associated according to several embodiments of this disclosure. In this regard, each drawing or block within a flow diagram of the drawings represents a process associated with embodiments of the method described. It should also be noted that in some alternative implementations, the acts noted in the drawings or blocks may occur out of the order noted in the figure or, for example, may in fact be executed substantially concurrently or in the reverse order, depending upon the act involved. Also, one of ordinary skill in the art will recognize that additional blocks that describe the processing may be added.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application and to enable others of ordinary skill in the art to understand the disclosure for various embodiments with various modifications as are suited to the particular use contemplated.

What is claimed is:

1. A cathodic arc coating system, the cathodic arc coating system comprising a coating disposed on a substrate, the coating including alternating layers of at least one of:

titanium vanadium nitride (TiVN) and titanium silicon vanadium nitride (TiSiVN); and titanium vanadium chromium nitride (TiVCrN) and titanium silicon vanadium nitride (TiSiVCrN), wherein the alternating layers are disposed on the substrate by a sub-hertz variable bias cathodic arc.

| Consumable Cathode | Ti atomic % | Si atomic % | V atomic % | N atomic % | Cr atomic % |
|---|---|---|---|---|---|
| TiSiV | 47 ± 3.5 | 4.5 ± 3.0 | 1.5 ± 0.5 | 49 ± 5.0 | |
| TiSiVCr | +3.5/−12.9 | +3.0/−3.9 | +0.5/−0.8 | +5.0/−14.8 | 10 ± 10 |

2. The cathodic arc coating system according to claim 1, wherein the alternating layers have a thickness in a range from about 1 nanometer (nm) to about 100 nm.

3. The cathodic arc coating system according to claim 1, wherein the alternating layers have a thickness in a range from about 5 nanometers (nm) to about 100 nm.

4. The cathodic arc coating system according to claim 1, wherein the alternating layers have a thickness of about 10 nanometers (nm).

5. The cathodic arc coating system according to claim 1, wherein the sub-hertz variable bias varies with time as a sinusoidal wave, the sinusoidal wave having a frequency in a range between about 0.1 hertz (Hz) and about 1 Hz.

6. The cathodic arc coating system according to claim 1, wherein the sub-hertz variable bias varies with time in a periodic manner, with one or more periodic features being expressed with a frequency in a range between 0.1 hertz (Hz) and about 1 Hz.

7. The cathodic arc coating system according to claim 1, wherein the sub-hertz variable bias includes a modified variable bias waveform with a modified bias to control the incorporation of at least one of: vanadium (V), silicon (Si), and Cr.

8. The cathodic arc coating system according to claim 7, further comprising a chamber and a consumable cathode, wherein the substrate is disposed in the chamber and the consumable cathode, and the chamber functions as an anode;

wherein the sub-hertz variable bias creates a potential to attract highly energized metallic ions from the consumable cathode, the highly energized metallic ions are ejected from the consumable cathode, and the highly energized metallic ions are accelerated to the substrate.

9. The cathodic arc coating system according to claim 8, wherein the substrate is provided with a periodically varying negative charge.

10. The cathodic arc coating system according to claim 8, wherein the chamber includes nitrogen (N) gas therein.

11. The cathodic arc coating system according to claim 8, wherein the consumable cathode includes titanium (Ti), vanadium (V), silicon (Si), and sometimes chromium (Cr).

12. A sub-hertz variable bias cathodic arc process, the process comprising:

depositing a coating on a substrate with alternating layers of at least one of:

titanium vanadium nitride (TiVN) and titanium silicon vanadium nitride (TiSiVN) on the substrate; and titanium vanadium chromium nitride (TiVCrN) and titanium silicon vanadium chromium nitride (TiSiVCrN) on the substrate.

13. The sub-hertz variable bias cathodic arc process according to claim 12, wherein the alternating layers have a thickness in a range from about 1 nanometer (nm) to about 100 nm.

14. The sub-hertz variable bias cathodic arc process according to claim 12, wherein depositing the alternating layers includes depositing by a sub-hertz variable bias cathodic arc.

15. The sub-hertz variable bias cathodic arc process according to claim 14, wherein the sub-hertz variable bias varies with time as an approximate sinusoidal wave, the approximate sinusoidal wave having a frequency in a range between 0.1 hertz (Hz) and about 1 Hz.

16. The sub-hertz variable bias cathodic arc process according to claim 12, wherein the sub-hertz variable bias includes a modified variable bias waveform with a reduced maximum voltage bias to incorporate vanadium (V) and silicon (Si) into the alternating layers of at least one of:

titanium vanadium nitride (TiVN) and titanium silicon vanadium nitride (TiSiVN); and alternating layers of titanium vanadium chromium nitride (TiVCrN) and titanium silicon vanadium nitride (TiSiVCrN).

17. The sub-hertz variable bias cathodic arc process according to claim 12, wherein the cathodic arc process includes:

disposing a consumable cathode in a chamber;

disposing the substrate in communication with the chamber, wherein the chamber functions as an anode;

disposing a reactant gas in the chamber;

applying a sub-hertz variable bias to the substrate, generating an electrical arc on the cathode, wherein the arc traverses a face of the cathode;

creating highly energized metallic ions by the arc interacting with the consumable cathode;

ejecting highly energized metallic ions from the face of the consumable cathode; and accelerating the highly energized metallic ions to the substrate.

18. The sub-hertz variable bias cathodic arc process according to claim 17, wherein applying the sub-hertz variable bias includes:

applying the sub-hertz variable bias at a first voltage where the ejected highly energized metallic ions from the consumable cathode pass through the reactant gas at a first velocity and partially react with the reactant gas, wherein the reactant gas includes at least one of nitrogen ($N_2$) and oxygen ($O_2$), and the ejected highly energized metallic ions are deposited on the substrate; and applying the sub-hertz variable bias at a second voltage where the ejected highly energized metallic ions pass through the reactant gas at a second velocity in the chamber, wherein at the second speed, the ejected highly energized metallic ions enable a chemical reaction with the at least one of nitrogen and oxygen to form a reaction product, and the reaction product is deposited; and applying the sub-hertz variable bias in a manner that systematically controls deposition efficiency of individual constituent elements from the consumable cathode onto the substrate such that the prevalence of one or more elements in a resulting microstructure of the coated substrate varies periodically as a function of distance from the original substrate surface, in accordance to the applied variable bias, whether the constituent elements are ultimately incorporated in the microstructure of the coated substrate as part of a reaction product as described above or partially reacted metallic ions as described above.

19. The sub-hertz variable bias cathodic arc process according to claim 18, wherein t the consumable cathode includes at least one of:

titanium (Ti), vanadium (V), silicon (Si); and titanium (Ti), vanadium (V), silicon (Si), and chromium (Cr).

20. The sub-hertz variable bias cathodic arc process according to claim 14, wherein the sub-hertz variable bias varies with time in a periodic manner, with one or more periodic features being expressed with a frequency in a range between 0.1 hertz (Hz) and about 1 Hz.

* * * * *